(12) United States Patent
Kim et al.

(10) Patent No.: US 7,855,144 B2
(45) Date of Patent: Dec. 21, 2010

(54) METHOD OF FORMING METAL LINES AND BUMPS FOR SEMICONDUCTOR DEVICES

(75) Inventors: Soon-bum Kim, Suwon-si (KR); Sung-min Sim, Seongnam-si (KR); Dong-hyeon Jang, Suwon-si (KR); Jae-sik Chung, Yongin-si (KR); Se-yong Oh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1085 days.

(21) Appl. No.: 11/589,717

(22) Filed: Oct. 31, 2006

(65) Prior Publication Data

US 2008/0076248 A1  Mar. 27, 2008

(30) Foreign Application Priority Data

Sep. 22, 2006  (KR) .................. 10-2006-0092456

(51) Int. Cl.
*H01L 21/44* (2006.01)
(52) U.S. Cl. .................. 438/652; 438/614; 438/669; 438/687
(58) Field of Classification Search .................. 438/612, 438/613, 614, 652, 669, 676, 678, 687; 257/737, 257/738, 750, 762, 772
See application file for complete search history.

(56) References Cited

U.S. PATENT DOCUMENTS

| 5,486,282 A | * | 1/1996 | Datta et al. .................. 438/614 |
| 5,705,857 A | * | 1/1998 | Farooq et al. ................ 257/762 |
| 2003/0146520 A1 | * | 8/2003 | Fang .......................... 257/778 |

FOREIGN PATENT DOCUMENTS

| JP | 2005-038979 | 2/2005 |
| KR | 10-2005-0028377 | 3/2005 |
| KR | 1020060007531 A | 1/2006 |
| KR | 1020060007846 A | 1/2006 |

OTHER PUBLICATIONS

Korean Office Action dated Jun. 20, 2007.

* cited by examiner

*Primary Examiner*—Kevin M Picardat
(74) *Attorney, Agent, or Firm*—Harness, Dickey & Pierce, P.L.C.

(57) ABSTRACT

Provided is a method of forming conductors (e.g., metal lines and/or bumps) for semiconductor devices and conductors formed from the same. First and second seed metal layers may be formed. At least one mask may be formed on a portion on which a conductor is to be formed. An exposed portion may be oxidized. The oxidized portion may be removed. A conductive structure may be formed on an upper surface of a portion which is not oxidized. The conductors may be metal lines and/or bumps. The conductive structures may be solder balls.

15 Claims, 6 Drawing Sheets

METHOD OF FORMING METAL LINES AND BUMPS FOR SEMICONDUCTOR DEVICES

PRIORITY STATEMENT

This application claims priority under 35 U.S.C. §119 to Korean Patent Application No. 10-2006-0092456, filed on Sep. 22, 2006, in the Korean Intellectual Property Office (KIPO), the entire contents of which are incorporated herein by reference.

BACKGROUND

1. Field

Example embodiments relate to a method of forming conductors (e.g., metal lines and/or bumps) for semiconductor devices and conductors (e.g., metal lines and/or bumps) formed from the same. Other example embodiments relate to a method forming conductors (e.g., metal lines and/or bumps) for semiconductor packages by which an undercut problem may be solved, yield of semiconductor packages may be improved, and/or a smaller amount of inexpensive photoresist may be used to reduce manufacturing cost and conductors (e.g., metal lines and/or bumps) formed from the same.

2. Description of the Related Art

Package technology for semiconductor chips has been studied to satisfy demands for higher-speed, lighter, and/or more compact electronic products. Wafer level packages (WLPs) may have been introduced to replace conventional plastic packages. Processes for manufacturing WLPs may be performed in a wafer state and chip size packages may be realized. A general structure of a conventional WLP is shown in FIG. 1.

Referring to FIG. 1, in a WLP 10, an input and output pad 12 of a semiconductor chip 11 may be electrically connected to a solder ball 15, which is an external connection terminal, through a metal line 16 for pad redistribution formed above the semiconductor chip 11. A seed layer 14 may be formed on the semiconductor chip 11. A method of forming the metal line 16 for pad redistribution will now be described with reference to FIGS. 2A-2D.

Referring to FIG. 2A, a seed layer 22 may be formed on a semiconductor chip 21. The seed layer 22 may be formed of two metal layers, e.g., upper and lower metal layers. The upper metal layer underneath a mask 23, which will be described later, may be formed of a metal which may be plated and more easily grown. The lower metal layer on the semiconductor chip 21 may be mainly formed of a metal which may prevent or retard the upper metal layer from being diffused.

The mask 23 may be formed to have openings in which metal lines are to be formed. A surface of the seed layer 22 on which the mask 23 may have been formed may be immersed in a plating solution to be plated so as to form metal lines 24 as shown in FIG. 2B. The mask 23 may be removed as shown in FIG. 2C, and portions of the seed layer 22 on which metal lines have not been formed may be removed to form metal lines for pad redistribution as shown in FIG. 2D.

When portions of the seed layer 22a are removed, portion A shown in FIG. 2D may be etched, and thus an undercut problem may occur as shown in FIG. 3. Also, the mask 23 may be mainly photoresist and thus may not be melted in the plating solution. The mask 23 may be expensive and must be thicker than a height of metal lines. A relatively large amount of photoresist may be consumed, and thus cost may increase.

Also, an edge bead removal (EBR) may be performed along an outer circumference of a wafer to prepare a space for contacting electrodes. Yield may be decreased. Photoresist may be removed to a width of about 400 micrometers along the outer circumference of the wafer, and electrodes may contact the removed portion of the photoresist to form metal lines. Semiconductor chips positioned at an edge of the wafer may be sacrificed.

SUMMARY

Example embodiments provide a method for forming conductors (e.g., metal lines and/or bumps) by which an undercut problem may be considerably solved, yield of a semiconductor package may be improved, and/or a smaller amount of inexpensive photoresist may be used to reduce manufacturing cost. Example embodiments also provide conductors (e.g., metal lines and/or bumps) in which undercut almost does not arise and/or which may be manufactured at a lower cost.

According to example embodiments, a method of forming conductors may include forming first and second seed metal layers on a front surface of a semiconductor chip, forming at least one mask on portions of the first seed metal layer on which the conductors are to be formed to expose portions of the first seed metal layer on which the conductors are not to be formed, oxidizing the exposed portions of the first seed metal layer to form a metal oxide, removing the at least one mask, plating a metal on a surface of the first seed metal layer exposed by removing the at least one mask to form the conductors and removing the portions of the second seed metal layer on which conductors are not formed. The conductors may be metal lines and/or bumps. Plating the metal may include plating a bump metal.

The method may further include removing the metal oxide after plating the metal on the surface of the first seed metal layer and before removing portions of the second seed metal layer. Removing the metal oxide may include immersing a surface of the semiconductor chip on which the metal oxide may be formed in a liquid including sulfuric acid. The first seed metal layer may be formed of copper, silver, and/or an alloy of copper and silver. The second seed metal layer may be formed of titanium and/or an alloy of titanium.

The at least one mask may be formed of at least one photoresist. The metal may be oxidized using a wet process and/or an oxygen plasma process to form the metal oxide. Forming the conductors may include immersing a surface of the semiconductor chip to be plated in a plating solution including an acid electrolyte. The acid electrolyte may be a sulfuric acid. The conductors may be metal lines and/or bumps. The second seed metal layer may be removed using a dry and/or wet etching method.

According to other example embodiments, a conductor may include first and second seed metal layers which are sequentially stacked and a conductive structure on the first seed metal layer. The conductor may be a metal line and/or a bump. The conductive structure may have an elliptical section perpendicular to a longitudinal direction of the metal line. The conductive structure may be a solder ball. The conductive structure may enclose a side of the first seed metal layer.

BRIEF DESCRIPTION OF THE DRAWINGS

Example embodiments will be more clearly understood from the following detailed description taken in conjunction with the accompanying drawings. FIGS. 1-7C represent non-limiting, example embodiments as described herein.

FIG. 1 is a diagram illustrating a method of pad redistribution for a conventional wafer level package (WLP);

FIG. 3 is an enlarged diagram of portion A shown in FIG. 2D;

FIGS. 7A and 7C are diagrams of bumps according to example embodiments; and

DETAILED DESCRIPTION OF EXAMPLE EMBODIMENTS

Figure 1:
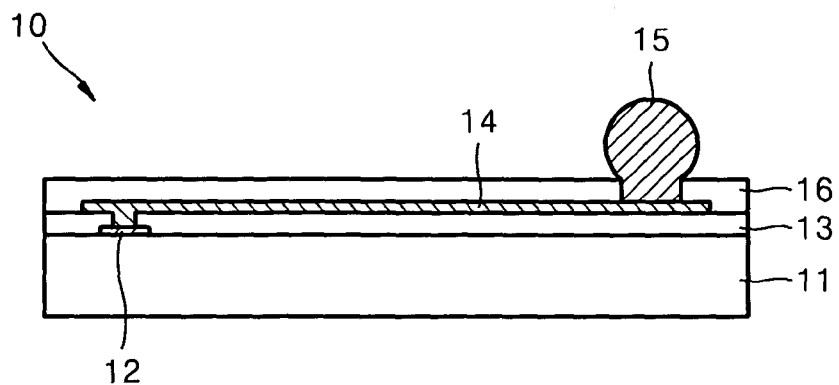
Figure 2A:
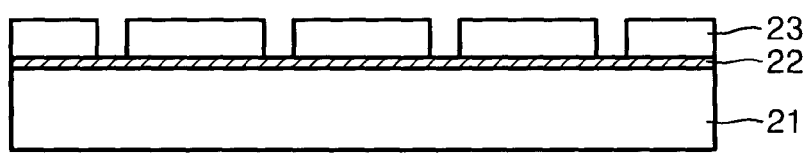
FIGS. 2A-2D are diagrams illustrating a conventional method of pad redistribution performed in a WLP.
Figure 2B:
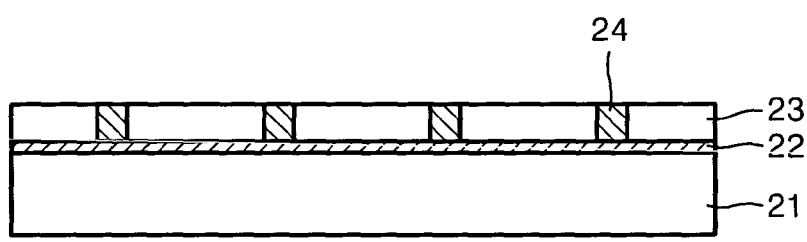
Figure 2C:
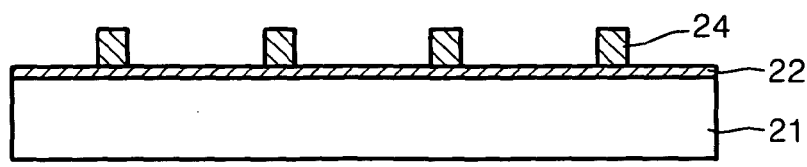
Figure 2D:
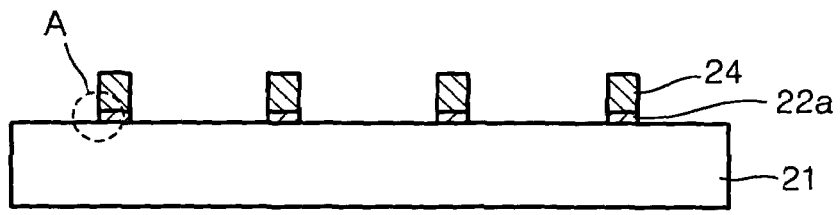
Figure 3:
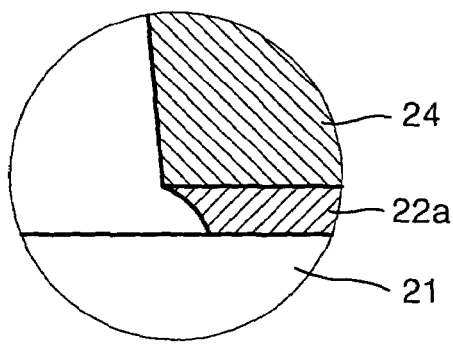

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90° or at other orientations) and the spatially relative descriptors used herein interpreted accordingly.

The terminology used herein is for the purpose of describing example embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 4A-4F are diagrams illustrating a method of forming metal lines according to example embodiments. These metal lines may correspond to the metal lines for pad redistribution of a wafer level package (WLP).

Figure 4A:
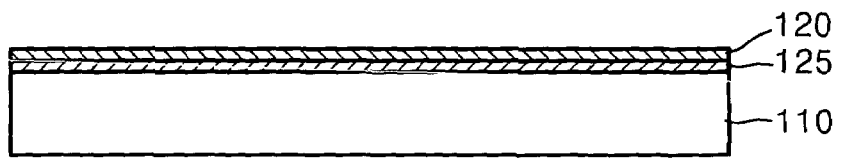
FIGS. 4A-4F are diagrams illustrating a method of forming metal lines according to example embodiments.

Referring to FIG. 4A, first and second seed metal layers 120 and 125 may be formed on a front surface of a semiconductor chip 110. The second seed metal layer 125 may be formed of an electrically conductive metal that hardly generates and is not limited specifically. The second seed metal layer 125 may be formed of titanium (Ti) and/or an alloy of Ti which may prevent or retard diffusion between metals. For example, the second seed metal layer 125 may be formed of Ti, an alloy of Ti and copper (Cu), an alloy of Ti, Cu, and nickel (Ni) and/or an alloy of chromium (Cr) and copper (Cu).

The first seed metal layer 120 may be formed of a metal which may be more easily oxidized, for example, Cu, silver (Ag), and/or an alloy of Cu and Ag. The first and second seed metal layers 120 and 125 may be formed using sputtering and/or chemical vapor deposition (CVD), but may not be limited to these methods. A thickness of each of the first and second seed metal layers 120 and 125 may be within a range between about 2000 Å and about 5000 Å.

Figure 4B:
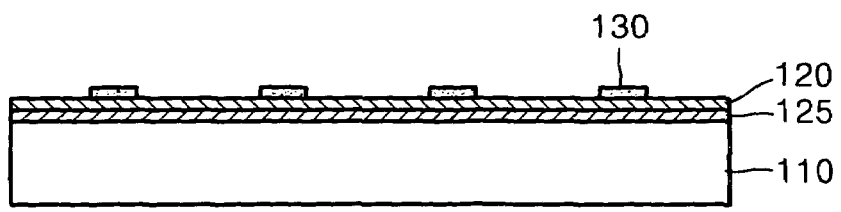

Referring to FIG. 4B, at least one mask 130 may be formed on portions of the first seed metal layer 120 on which metal lines are to be formed, and portions of the first seed metal layer 120 on which metal lines are not to be formed may be exposed. For example, the at least one mask 130 may be formed of at least one photoresist but may not be limited to this. If the at least one mask 130 are formed of at least one photoresist, the at least one mask 130 may be formed using processes of coating, exposing, and developing the at least one photoresist. The processes of coating, exposing, and developing the at least one photoresist may be performed using a conventional well-known method. The at least one mask 130 may not need to be higher than metal lines to be formed but may have a thickness enough not to disappear in a subsequent process. The at least one mask 130 may have a thickness between about 100 nm and about 3000 nm.

Figure 4C:
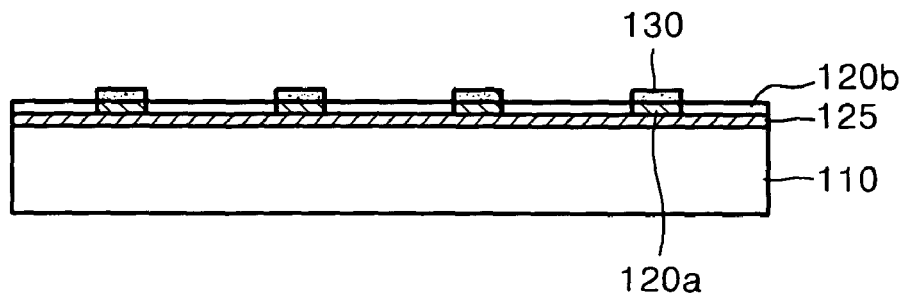

Referring to FIG. 4C, the exposed portions of the first seed metal layer 120a may be oxidized to form a metal oxide 120b. As shown in FIG. 4C, ions may be injected into the first seed metal layer 120 using oxygen plasma and/or the exposed portions of the first seed metal layer 120 may be immersed in an oxidative liquid to form the metal oxide 120b which is exposed. The method of forming the metal oxide 120b may not be limited to this. For example, the oxidative liquid may be a liquid in which hydrogen peroxide ($H_2O_2$) is dissolved.

Figure 4D:
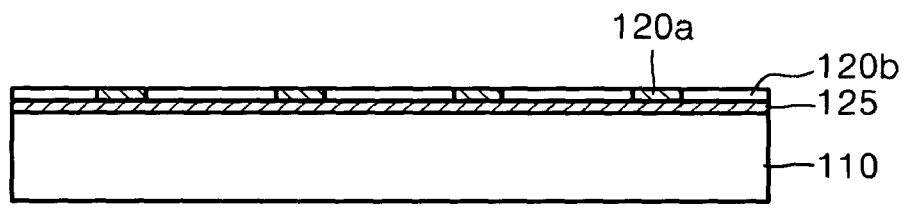

Referring to FIG. 4D, the at least one mask 130 may be removed. A method of removing the at least one mask 130 may vary depending on properties of the at least one mask 130 and may be a known method. If the at least one mask 130 is formed of at least one photoresist, the at least one mask 130 may be removed using ashing and/or cleaning. A surface of the semiconductor chip 110 on which the at least one mask 130 have been removed and the metal oxide 120b has been formed may be immersed into a plating solution. The plating solution may be a solution in which ions of metal lines are dissolved and may selectively further include an acid electrolyte. For example, the acid electrolyte may be a sulfuric acid but may not be limited to this.

The plating may be electroplating. Because the metal oxide 120b is electrically nonconductive, a metal may not be plated on the metal oxide 120b. Also, because metals 120a, which are portions of the first seed metal layer 120, are electrically conductive, a metal may be plated on the metals 120a to form a line metal 140.

Figure 4E:
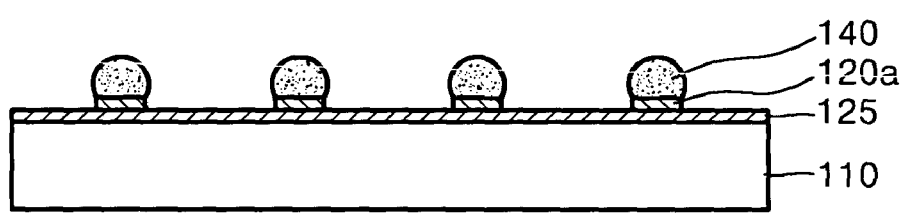
Figure 4F:
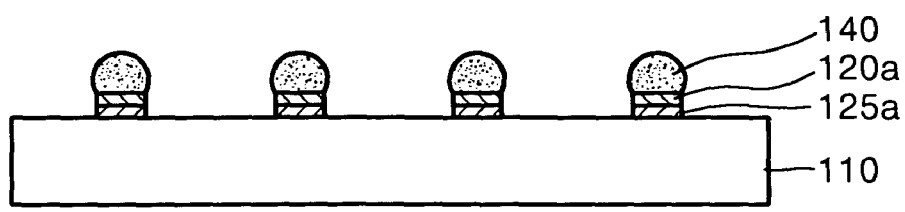

Referring to FIG. 4E, a metal may not be plated on the metal oxide 120b, while a metal may be plated on the metals 120a as the portions of the first seed metal layer 120. Cross-sections of plated metal lines may have roundish shapes similar to elliptical shapes. Referring to FIG. 4F, if the plating solution further includes the acid electrolyte, plating may be performed, and simultaneously, a metal oxide 120b may be acidized and thus removed. When plating of the metal and the removal of the metal oxide 120b are simultaneously performed, the sections of the metal lines show more peculiar shapes.

Figure 5A:
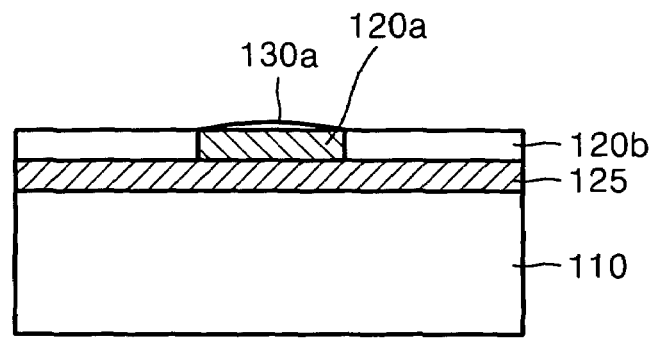
FIGS. 5A-5D are diagrams illustrating a process of etching a first seed metal layer and simultaneous plating a metal line in a method of forming the metal line according to example embodiments.
Figure 5B:
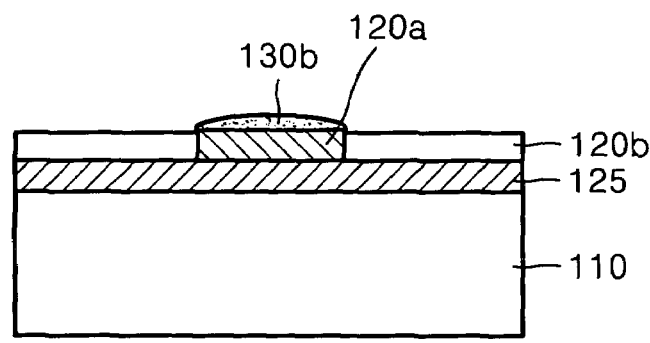

A method of forming the metal lines having the peculiar shapes will now be described with reference to FIGS. 5A-5D. Referring to FIG. 5A, a second seed metal layer 125 may be formed on a semiconductor chip 110. A line metal 130a may be relatively thinly formed on a first seed metal layer 120a. After a predetermined-or given period of time elapses, a portion of an upper surface of the metal oxide 120b may be removed by an acid electrolyte, and thus a step difference may occur between the metal oxide 120b and the first seed metal layer 120a as shown in FIG. 5B. Although the step difference occurs, a line metal 130b may be plated to plate three surfaces of the first seed metal layer 120a.

Figure 5C:
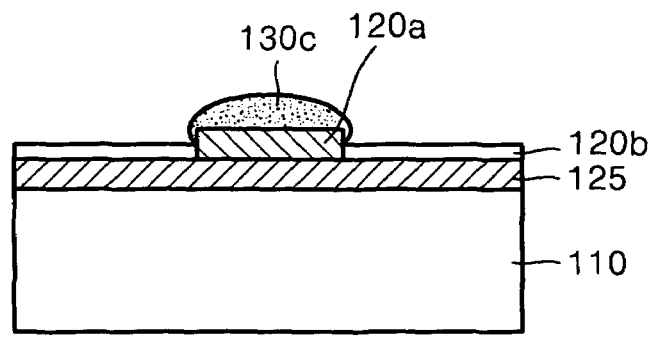
Figure 5D:
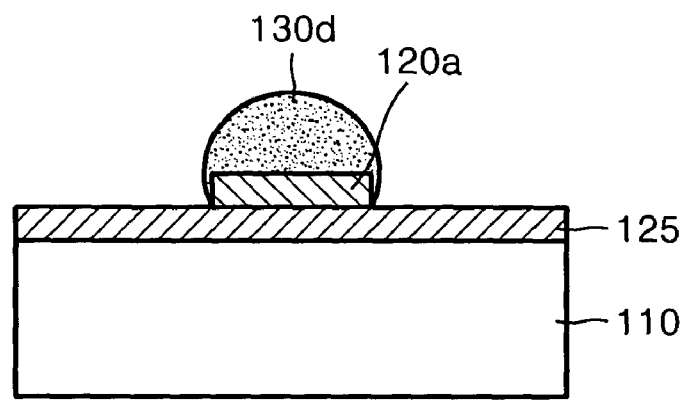

After a period of time further elapses, a considerable portion of the metal oxide 120b may be removed, and the step difference between the metal oxide 120b and the first seed metal layer 120a may be further increased as shown in FIG. 5C. A shape of a line metal 130c formed by plating may be roundish to be similar to an elliptical shape. After the metal oxide 120b is completely removed, a metal line 130d having a section similar to an elliptical shape may be obtained as shown in FIG. 5D.

According to example embodiments, etching of the metal oxide 120b may be performed, and simultaneously, a metal line 140 may be plated on a side of a portion corresponding to a metal line of the first seed metal layer 120. The first seed metal layer 120 may not be undercut at all. When the second seed metal layer 125 is removed in a subsequent process, the second seed metal layer 125 may be slightly undercut. Because the second seed metal layer 125 is thinner than a seed metal layer removed in the conventional art, the undercut may arise relatively slightly.

Referring to FIG. 4F, the second seed metal layer 125 among the metal lines 125a, 120a, and 140 may be removed. The second seed metal layer 125 may be removed using a dry and/or wet etching method and may not be limited to a specific method. As described above, in a method of forming metal lines according to example embodiments, at least one photoresist operating as at least one mask may not contact a plating solution. Thus, inexpensive photoresist may be used. Also, the at least one mask (e.g., at least one photoresist) may not be removed to perform an edge bead removal (EBR) process. The sacrifice of a semiconductor chip at an edge of a wafer may be reduced or minimized, and thus yield may be improved.

According to example embodiments, the method of forming the metal lines for pad redistribution may be applied to a method of forming bumps. If the metal line 140 corresponds to a bump, and metal lines may be replaced with bumps, the method of forming the metal lines may be applied to the method of forming the bumps. Repeated descriptions will be omitted here.

According to example embodiments, first and second seed metal layers may be stacked, and a line metal having an elliptical section may be provided on the first seed metal layer, wherein the elliptical section may be perpendicular to a longitudinal direction of the metal line.

Figure 6A:
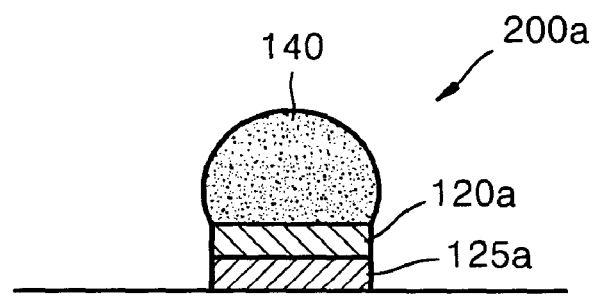
FIGS. 6A and 6B are diagrams of a metal line according to example embodiments.
Figure 6B:
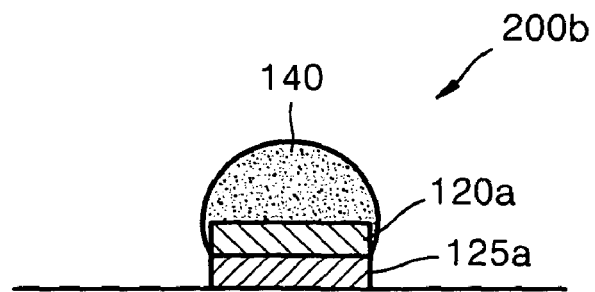

FIGS. 6A and 6B are diagrams of metal lines according to example embodiments. Referring to FIG. 6A, first and second seed metal layers 120a and 125a may be stacked. The first and second seed metal layers 120a and 125a extend in the direction as illustrated in FIG. 6A, which is a longitudinal direction of a metal line 200a. The line metal 140 having an elliptical section may be on the first seed metal layer 120a.

Referring to FIG. 6B, in a metal line 200b, a line metal 140 may enclose a side of a first seed metal layer 120a. This may be because the metal line 200b may be formed using the method described with reference to FIGS. 5A-5D. It has been described that the metal line 140 may have an elliptical shape. However, the elliptical shape refers to an elliptical shape in a mathematical meaning, a round shape, or a round shape compressed in a specific direction. These shapes belong to the scope of example embodiments. The elliptical shape may be expressed to exclude a metal line having a rectangular section from the scope of example embodiments, wherein the metal line is manufactured using a conventional manufacturing method.

The metal lines 200a and 200b according to example embodiments may be manufactured using the above-described method of forming metal lines according to example embodiments. According to example embodiments, first and second seed metal layers may be stacked, and a bump, in which a solder ball having an elliptical section may be on the first seed metal layer, may be provided.

Figure 7A:
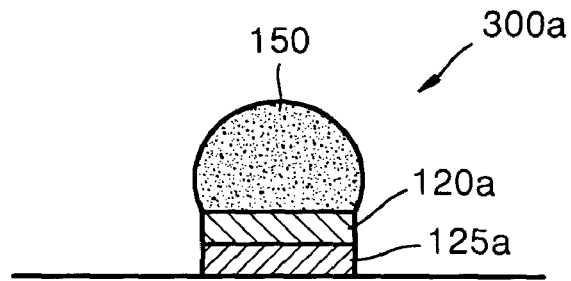
Figure 7B:
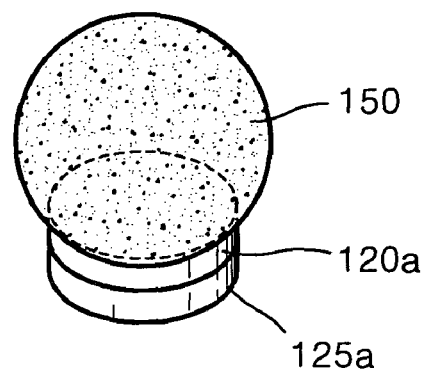
FIG. 7B is a diagram of the bump illustrated in FIG. 7A.
Figure 7C:
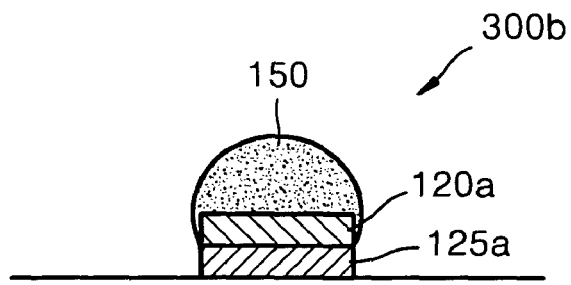

FIGS. 7A and 7C are diagrams of bumps according to embodiments, and FIG. 7B is a diagram of the bump illustrated in FIG. 7A. Referring to FIG. 7A, first and second seed metal layers 120a and 125a may be stacked. The first and second seed metal layers 120a and 125a may have disk shapes so as to be connected to a solder ball 150. The solder ball 150 having an elliptical shape may be on the first seed metal layer 120a. The first and second seed metal layers 120a and 125a and the solder ball 150 constitute a bump 300a.

Referring to FIG. 7C, a bump 300b may be formed so that a solder ball 150 encloses a side of a first seed metal layer 120a. This may be because a bump may be manufactured adopting the method described with reference to FIGS. 5A-5D. It has been described that the solder ball 150 may have the elliptical shape. However, the elliptical shape refers to an elliptical shape in a mathematical meaning, a round shape, or a round shape compressed in a specific direction. These shapes belong to the scope of example embodiments. The bumps 300a and 300b may be manufactured using the above-described method of forming bumps according to example embodiments.

As described above, in a method of forming metal lines and bumps for semiconductor devices according to example embodiments, an undercut problem may be solved. Also, yield of a semiconductor package may be improved. In addition, a smaller amount of inexpensive photoresist may be used to reduce manufacturing cost.

While example embodiments have been particularly shown and described with reference to example embodiments thereof, it will be understood by those of ordinary skill in the art that various changes in form and details may be made therein without departing from the spirit and scope as defined by the following claims.

What is claimed is:

1. A method of forming conductors, comprising:
forming first and second seed metal layers on a front surface of a semiconductor chip;

forming at least one mask on portions of the first seed metal layer on which the conductors are to be formed to expose portions of the first seed metal layer on which the conductors are not to be formed;

oxidizing the exposed portions of the first seed metal layer to form a metal oxide;

removing the at least one mask;

plating a metal on a surface of the first seed metal layer exposed by removing the at least one mask to form the conductors; and removing the portions of the second seed metal layer on which the conductors are not formed.

2. The method of claim 1, wherein the conductors are metal lines.

3. The method of claim 1, wherein the conductors are bumps.

4. The method of claim 1, wherein plating the metal includes plating a bump metal.

5. The method of claim 1, wherein after plating the metal on the surface of the first seed metal layer and before removing the portions of the second seed metal layer, the method further comprising:

removing the metal oxide.

6. The method of claim 5, wherein removing the metal oxide includes immersing a surface of the semiconductor chip on which the metal oxide is formed in a liquid including sulfuric acid.

7. The method of claim 1, wherein the first seed metal layer is formed of one of copper, silver, and an alloy of copper and silver.

8. The method of claim 1, wherein the second seed metal layer is formed of one of titanium and an alloy of titanium.

9. The method of claim 1, wherein forming the at least one mask includes forming at least one photoresist.

10. The method of claim 1, wherein oxidizing the exposed portions of the first seed metal layer includes using one of a wet process and an oxygen plasma process to form the metal oxide.

11. The method of claim 1, wherein forming the conductors includes immersing a surface of the semiconductor chip to be plated in a plating solution including an acid electrolyte.

12. The method of claim 11, wherein the acid electrolyte is a sulfuric acid.

13. The method of claim 11, wherein the conductors are metal lines.

14. The method of claim 11, wherein the conductors are bumps.

15. The method of claim 1, wherein removing portions of the second seed metal layer includes using one of dry and wet etching methods.

* * * * *